(12) United States Patent
Goh

(10) Patent No.: US 9,311,977 B2
(45) Date of Patent: Apr. 12, 2016

(54) EVENT CONTROLLED DECODING CIRCUIT

(71) Applicant: STMicroelectronics Asia Pacific Pte Ltd, Singapore (SG)

(72) Inventor: Beng-Heng Goh, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 14/469,860

(22) Filed: Aug. 27, 2014

(65) Prior Publication Data

US 2016/0064055 A1  Mar. 3, 2016

(51) Int. Cl.
  *G11C 8/00* (2006.01)
  *G11C 8/06* (2006.01)
  *G11C 8/04* (2006.01)
  *G11C 8/10* (2006.01)
  *G11C 8/18* (2006.01)
  *G11C 7/10* (2006.01)

(52) U.S. Cl.
  CPC .. *G11C 8/06* (2013.01); *G11C 8/04* (2013.01); *G11C 8/10* (2013.01); *G11C 8/18* (2013.01); *G11C 7/10* (2013.01)

(58) Field of Classification Search
  CPC .............. G11C 8/06; G11C 8/04; G11C 8/10; G11C 8/18; G11C 7/10
  USPC .............. 365/230.02, 189.07, 189.15, 230.06
  See application file for complete search history.

(56) References Cited

U.S. PATENT DOCUMENTS

| | | | | |
|---|---|---|---|---|
| 4,987,559 A | * | 1/1991 | Miyauchi et al. | ......... 365/189.04 |
| 5,276,856 A | * | 1/1994 | Norsworthy et al. | ......... 713/500 |
| 6,094,701 A | * | 7/2000 | Mochizuki et al. | ............... 711/5 |
| 6,108,252 A | * | 8/2000 | Park | ...................... G11C 29/50 |
| | | | | 365/189.07 |
| 8,654,555 B2 | | 2/2014 | Shin et al. | |
| 2003/0198098 A1 | * | 10/2003 | Fujioka et al. | ................. 365/200 |
| 2008/0212379 A1 | * | 9/2008 | Asauchi | ................. G11C 16/10 |
| | | | | 365/189.07 |

* cited by examiner

*Primary Examiner* — Tan T. Nguyen
(74) *Attorney, Agent, or Firm* — Gardere Wynne Sewell LLP

(57) ABSTRACT

A waveform generator circuit includes a memory with address locations storing output waveform defining data bits. An address counter generates an address for sequentially addressing the address locations in the memory. The memory responds by sequentially outputting the output waveform defining data bits at the addressed locations. An output circuit receives the waveform defining data bits output from the memory and operates to generate an output signal waveform having logic state values dependent on the sequentially output waveform defining data bits.

23 Claims, 9 Drawing Sheets

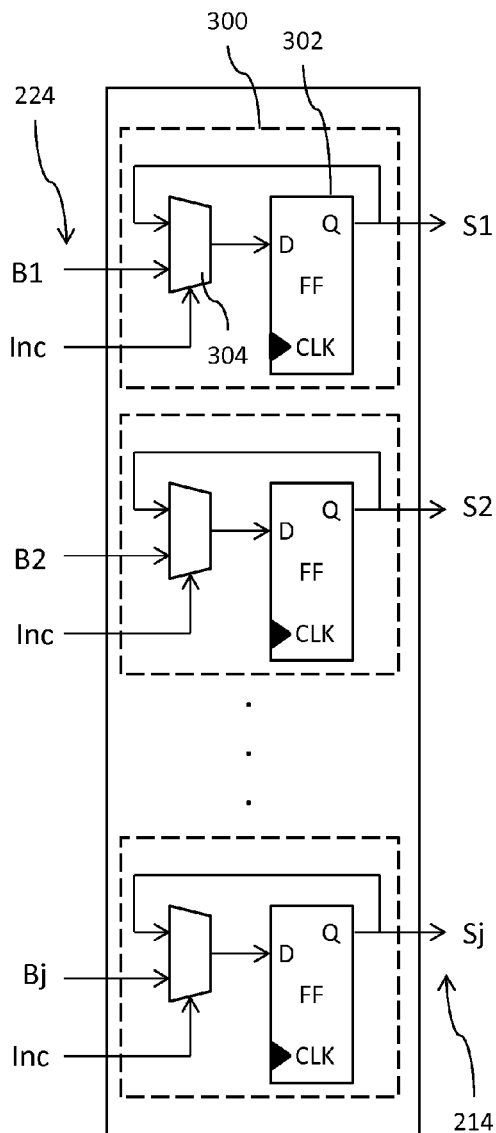
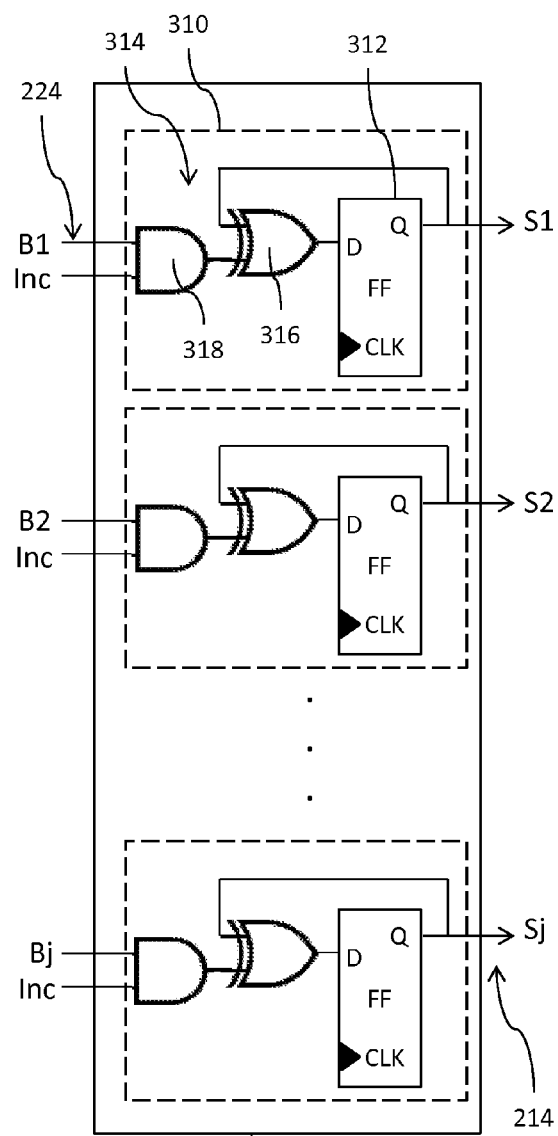
FIG. 5
FIG. 6

EVENT CONTROLLED DECODING CIRCUIT

TECHNICAL FIELD

This invention relates generally to electronic circuits, and more particularly to decoding circuits.

BACKGROUND

Reference is now made to FIG. 1 which illustrates a block diagram of a prior art event controlled decoding circuit 10. The circuit 10 is configured to receive a plurality of control inputs (C1-Ci) 12 and generate a plurality of output signals (S1-Sj) 14. The output signals 14 are generated by an output register circuit 16. The circuit 10 further includes a logic circuit 18 functioning as a decoder. A counter circuit 20 generates a count signal 22 which is applied to the logic circuit as a reference. The logic circuit 18 receives the control inputs 12, decodes the data of the control inputs and provides signals 24 in response to the count signal 22 to load the output register circuit 16 with data for generating the output signals 14.

The use of logic circuit 18 poses a number of concerns including: difficulty in adapting to required changes in output signal generation, complexity in the logic design in the number of inputs/outputs increases, and sub-optimal logic design. There is a need in the art to address the foregoing problems.

SUMMARY

In an embodiment, a circuit comprises: an output circuit configured to receive data bits and generate an output signal waveform having logic state values dependent on the received data bits; a time counter configured to increment in response to a clock signal; a memory having a plurality of address locations, each address location storing a signal transition time linked to said data bits for that signal transition time, said memory outputting the data bits when the address location is addressed; a comparator configured to compare a counter value output from the time counter to the signal transition times stored in said memory and generate an increment signal in response to each comparison match; and an address counter configured to generate an address for addressing said address locations in the memory, said address counter incrementing the address in response to the increment signal at each instance of a comparison match.

In an embodiment, a circuit comprises: a time counter configured to count a current time value; a memory having a plurality of address locations, each address location storing a signal transition time value, wherein each transition time value is linked to output waveform defining data bits; a comparator configured to compare current time value to the signal transition time values stored in said memory and generate an increment signal in response to each comparison match; an address counter configured to generate an address for addressing said address locations in the memory, said address counter incrementing the address in response to the increment signal, wherein said memory outputs the output waveform defining data bits at the addressed location in the memory; and an output circuit configured to receive output waveform defining data bits and generate an output signal waveform having logic state values dependent on said output waveform defining data bits.

In an embodiment, a circuit comprises: a memory having a plurality of address locations, each address location storing output waveform defining data bits; an address counter configured to generate an address for sequentially addressing said address locations in the memory, wherein said memory sequentially outputs the output waveform defining data bits at the addressed locations in the memory; and an output circuit configured to receive output waveform defining data bits from the memory and generate an output signal waveform having logic state values dependent on said sequentially output waveform defining data bits.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 5 is a block diagram for an embodiment of the output register circuit within FIG. 3;

FIG. 6 is a block diagram for an embodiment of the output register circuit within FIG. 3;

DETAILED DESCRIPTION OF THE DRAWINGS

Figure 1:
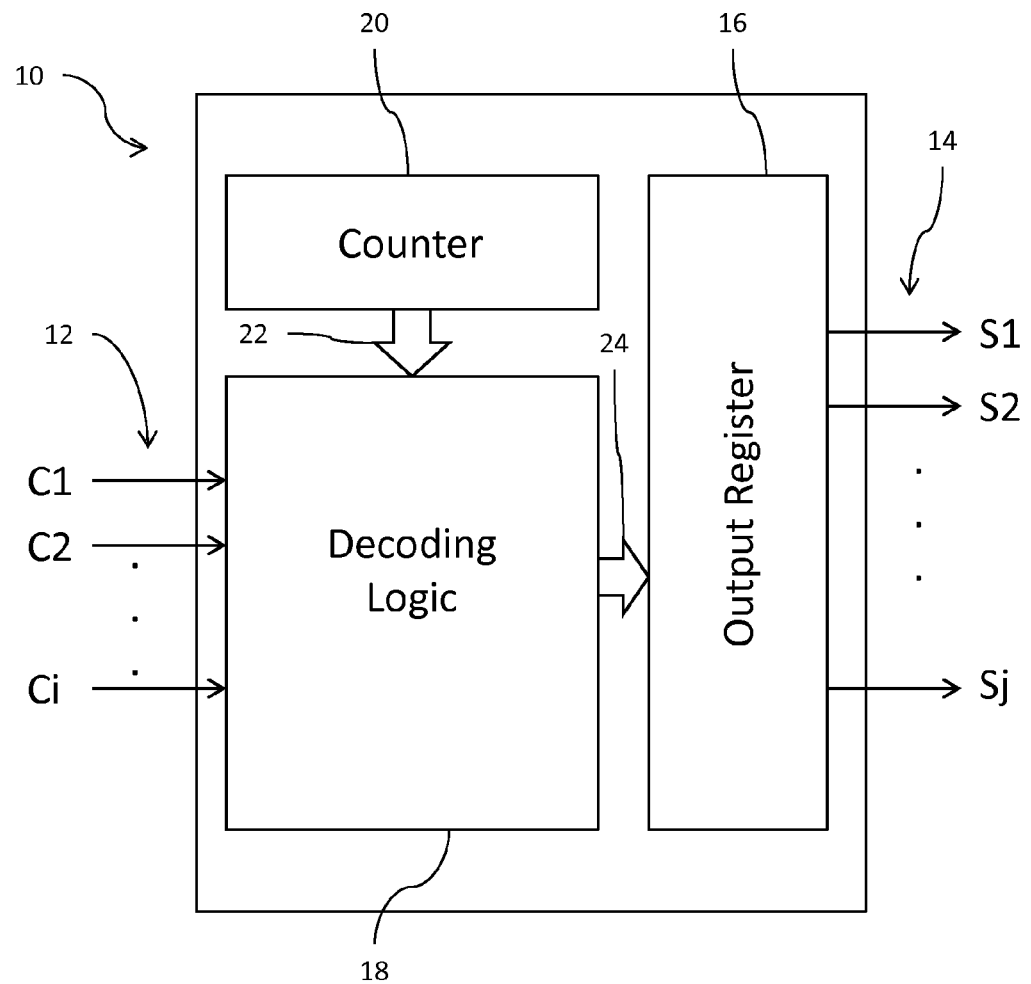
FIG. 1 is a block diagram of a prior art event controlled decoding circuit.
Figure 2:
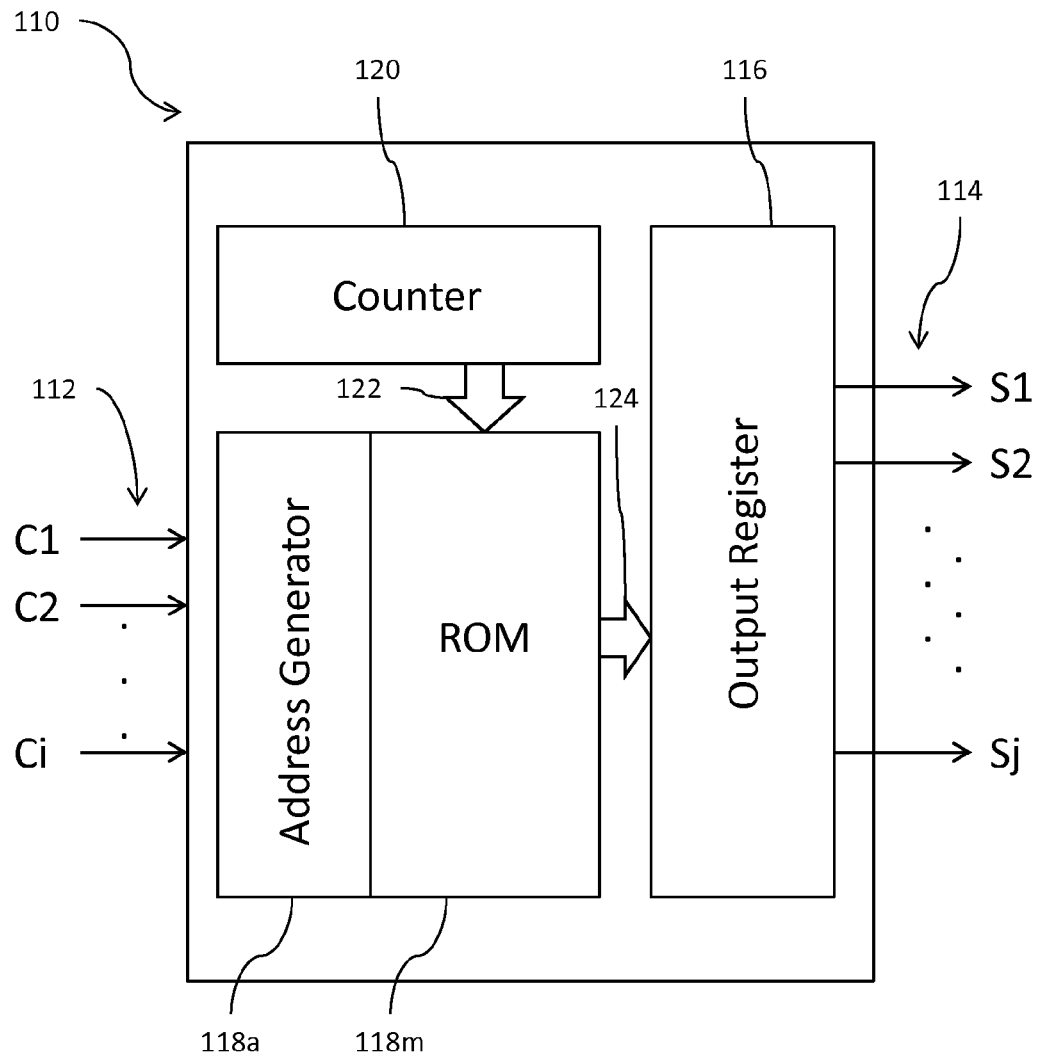
FIG. 2 is a block diagram of an embodiment for an event controlled decoding circuit.

Reference is now made to FIG. 2 which illustrates a block diagram of an embodiment for an event controlled decoding circuit 110. The circuit 110 is configured to receive a plurality of control inputs (C1-Ci) 112 and generate a plurality of output signals (S1-Sj) 114. The output signals 114 are generated by an output register circuit 116. The circuit 110 further includes a memory circuit including a read only memory 118m and an address generator 118a functioning as a decoder. A counter circuit 120 generates a count signal 122 which is applied to the memory as a reference. The address generator 118a generates an address signal which is applied to the memory 118m. The memory 118m responds to the address and the count signal 122 by outputting signals 124 to load the output register circuit 116 with data for generating the output signals 114. The control signals C1-Ci are used in connection with generating the waveform output by the output register 116 (for example, by making a selection between multiple options for the waveforms at each signal output).

Figure 3:
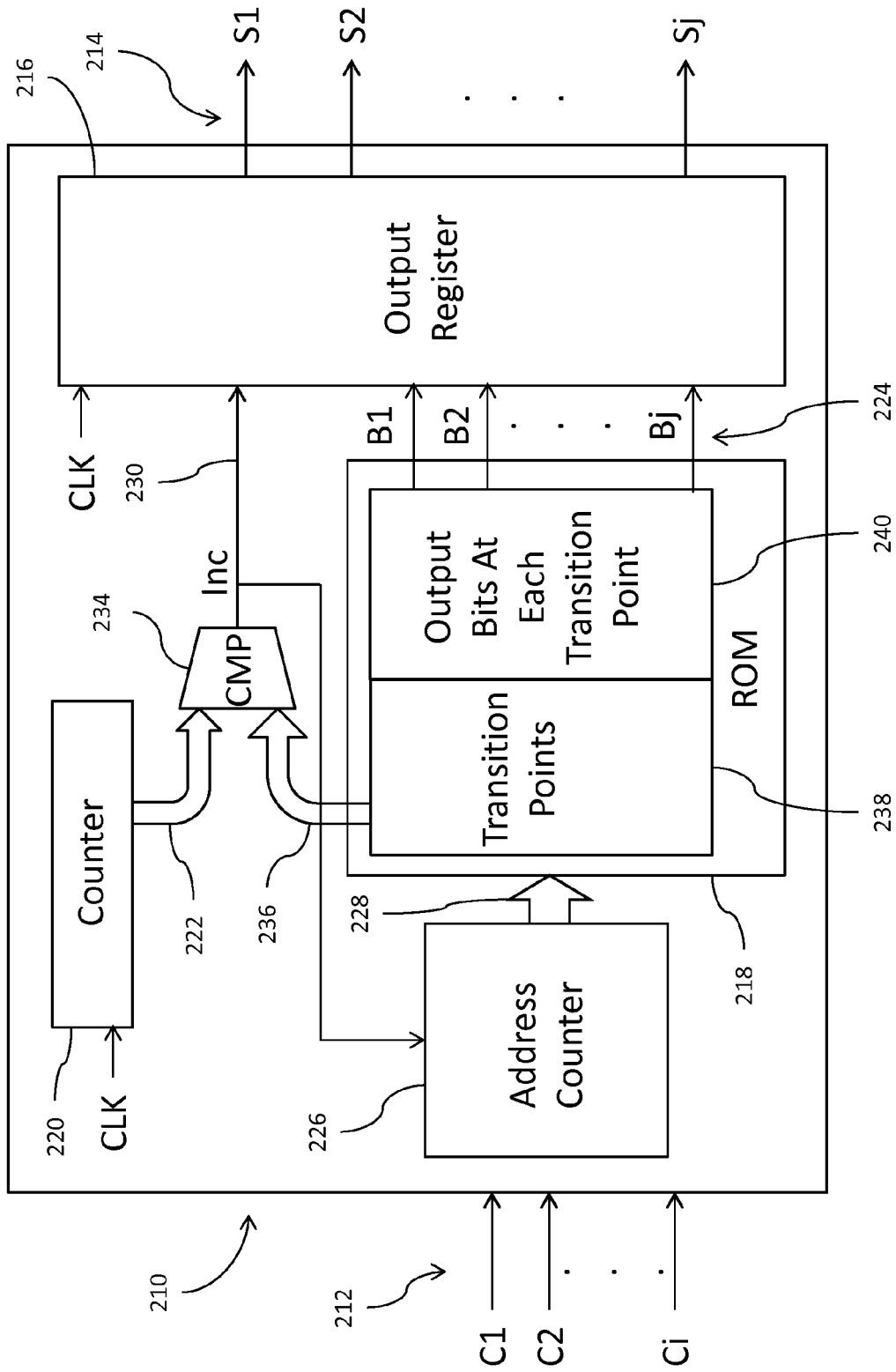
FIG. 3 is a block diagram of an embodiment for an event controlled decoding circuit.

Reference is now made to FIG. 3 which illustrates a block diagram of an embodiment for an event controlled decoding circuit 210. The circuit 210 is configured to receive a plurality of control inputs (C1-Ci) 212 and generate a plurality of output signals (S1-Sj) 214. The output signals 214 are generated by an output register circuit 216. The circuit 210 further includes a read only memory (ROM) 218 (which may alternatively comprise a random access memory (RAM)). The control inputs 212 may specify one or more selected waveform(s) for generation. There is a starting address in the read only memory 218 where the selected waveform data is stored. An address counter outputs a memory address 228 (which is initiated at that starting address). The address counter 226 further receives an increment signal (Inc) 230 in response to which the address counter 226 increments the output memory address 228. A counter circuit 220 generates a count signal 222 which is essentially a time counter or time reference. A comparator circuit (CMP) 234 compares the count signal 222 to a data signal 236 comprising data 238 stored in the memory 218 (at the current output memory address 228) identifying signal transition points. The comparator circuit 234 outputs the increment signal 230 with the increment signal pulsing active each time the count signal 222 matches the data signal 236. The read only memory 218 further stores data 240 comprising the stored bits for each of the output signals (S1-Sj) 214. This data is paired (or linked in memory) with corresponding addressed signal transition point data 238, with the memory 218 outputting the addressed stored bit data 240 as bit signals (B1-Bj) 224 to load the output register circuit 216 with data for generating the output signals 214. The output register circuit 216 receives the bit signals (B1-Bj) 224 and stores the bit data to generate and output the output signals (S1-Sj) 214 with corresponding logic states. The data latch function of the output register circuit 216 is controlled in response to the increment signal 230. When the increment signal pulses active (i.e., each time the count signal 222 matches the data signal 236), the output register circuit 216 receives and latches the bit signals (B1-Bj) 224 and stores the signal bit data. Otherwise, the previously latched signal bit data from the bit signals (B1-Bj) 224 is held by the output register circuit 216.

The following table illustrates an exemplary implementation for the organization of the read only memory 218 along with sample stored bit data:

| Address | Transition Point | Bj | ... | B2 | B1 |
|---|---|---|---|---|---|
| a | 0 | 1 | | 1 | 0 |
| a + 1 | 10 | 0 | | 0 | 1 |
| a + 2 | 22 | 0 | | 1 | 0 |
| a + 3 | 53 | 1 | | 1 | 1 |

In the table, the reference "a" represents an address in the read only memory 218 which is the starting address for accessing the selected waveform data. The counter circuit 220 is reset and outputs a data value of "0" as the count signal 222. The memory 218 outputs the stored bit data <1 . . . 10> (as signal bits) at the address "a" as the bit signals (B1-Bj) 224. The transition point data value at address "a" is "0", and thus a data value of "0" for the count signal 222 is output to the comparator circuit 234. The comparator circuit 234 compares the count signal 222 (data value "0") to the data signal 236 (data value "0") and finds a match. In response thereto, the increment signal 230 pulses active. The output register circuit 216 responds to the pulse of the increment signal 230 and latches the bit data from the output bit signals (Bj) at the next clock transition.

In an exemplary embodiment, the bit data comprise signal bits representing logic states for the output signal waveform to be generated. The first output signal (S1) 214 transitions to logic "0" because latched data of the first bit signal (B1) is logic "0". The second output signal (S2) 214 transitions to logic "1" because latched data of the second bit signal (B2) is logic "1". The j-th output signal (Sj) 214 transitions to logic "1" because latched data of the j-th bit signal (B2) is logic "1". Also in response to the pulse of the increment signal 230, the address counter 226 increments to the next address "a+1". At the next increment of the clock (CLK) signal, the count signal 222 also increments (to data value "1") and the comparator circuit 234 no longer finds a match between the count signal 222 (data value "1") to the data signal 236 (data value "10"). The increment signal 230 no longer pulses active and the previously latched signal bit data from the bit signals (B1-Bj) 224 are held by the output register circuit 216.

The memory 218 now outputs the signal bit data <0 . . . 01> at the address "a+1" as the bit signals (B1-Bj) 224 and the transition point data value at that address "a+1" is "10". When the counter circuit 220 later increments in response to the clock signal (CLK) to a data value of "10", the comparator circuit 234 again finds a match between the count signal 222 (data value "10") and the data signal 236 (data value "10"). In response thereto, the increment signal 230 pulses active. The output register circuit 216 responds to the pulse of the increment signal 230 and latches the signal bit data from the output bit signals (B1-Bj). The first output signal (S1) 214 transitions to logic "1" because latched data of the first bit signal (B1) is logic "1". The second output signal (S2) 214 transitions to logic "0" because latched data of the second bit signal (B2) is logic "0". The j-th output signal (Sj) 214 transitions to logic "0" because latched data of the j-th bit signal (Bj) is logic "0". Also in response to the pulse of the increment signal 230, the address counter 226 increments to the next address "a+2". At the next increment of the clock (CLK) signal, the count signal 222 also increments (to data value "11") and the comparator circuit 234 no longer finds a match between the count signal 222 (data value "11") to the data signal 236 (data value "22"). The increment signal 230 no longer pulses active and the previously latched signal bit data from the bit signals (B1-Bj) 224 are held by the output register circuit 216.

The process repeats in accordance with the foregoing examples with incrementing of the address and the counting of the counter.

Figure 4:
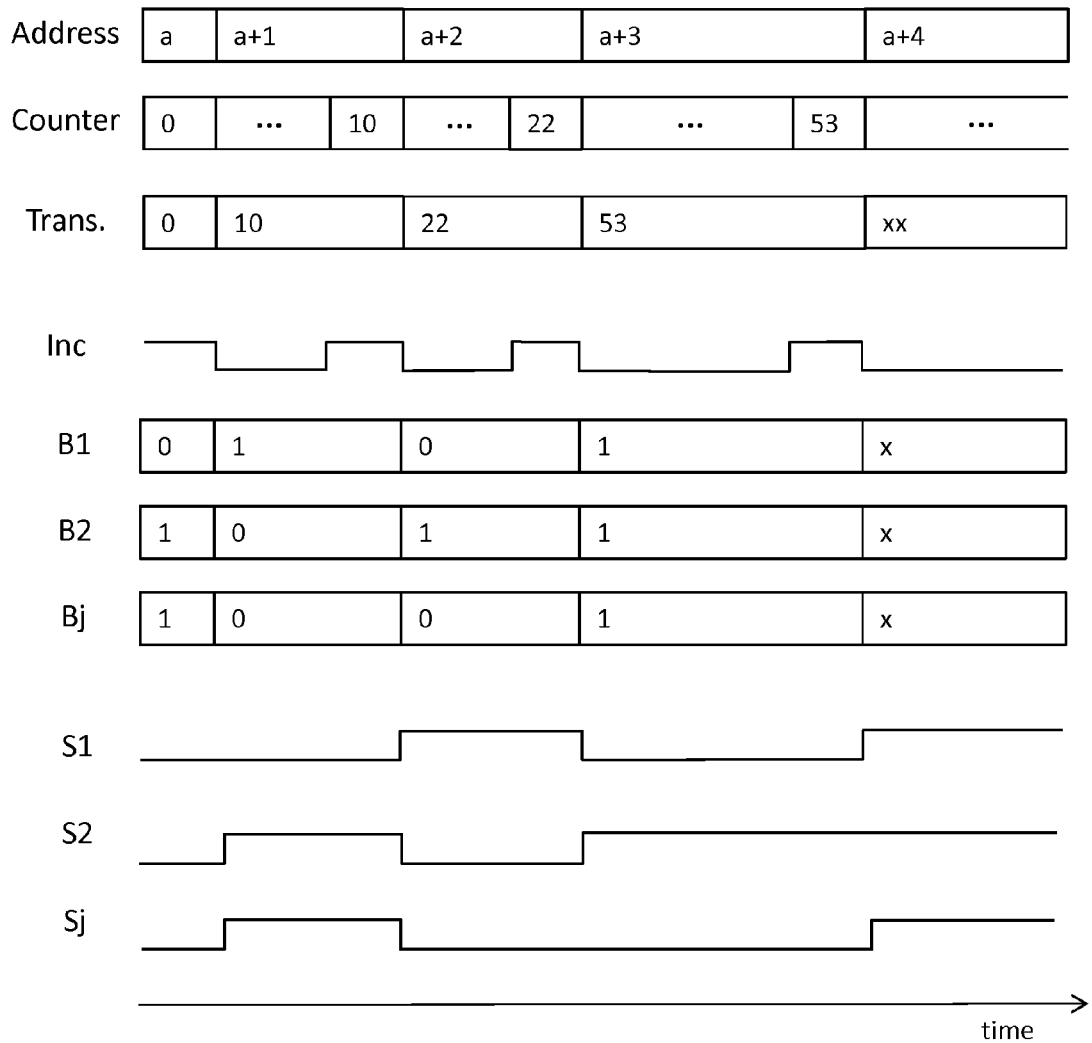
FIG. 4 illustrates the operational waveforms for the circuit of FIG. 3.

Reference is now made to FIG. 4 which illustrates the operational waveforms for the circuit of FIG. 3 using the data of the previous table. Here, the logic state of the output signals 214 follows the logic state of the bit signals 224 at the clock transition following assertion of the increment (Inc) signal.

Reference is now made to FIG. 5 which illustrates a block diagram for an embodiment of the output register circuit 216 within FIG. 3. The output register circuit is formed by j register latch circuits 300. Each circuit 300 comprises a flip-flop circuit 302 (for example, of the D-type) and a multiplexer circuit 304. The data (D) input of the flip-flop circuit 302 is coupled to the output of the multiplexer circuit 304. The output (Q) of the flip-flop circuit 302 is coupled to a first input of the multiplexer circuit 304. The output (Q) of the flip-flop circuit 302 further provides the output signal (Sj). The second input of the multiplexer circuit 304 is coupled to receive the bit signal (Bj). The control input of the multiplexer circuit 304 is coupled to receive the increment signal (Inc) 230.

When the increment signal (Inc) is logic low, the multiplexer circuit 304 selects the data value present at the first input for output and application to the data (D) input of the flip-flop circuit 302. Because of the feedback from the output (Q) of the flip-flop circuit 302 to the first input of the multiplexer circuit 304, the logic low value of the increment signal causes the register latch circuit 300 to operate in a hold mode of operation where the previous value of the output signal (Sj) is held.

When the increment signal (Inc) pulses active to logic high, the multiplexer circuit 304 selects the data value present at the second input for output and application to the data (D) input of the flip-flop circuit 302. Because the second input is configured to receive the bit signal (Bj), the pulse active state of the increment signal (Inc) causes the register latch circuit 300 to operate in a latch mode of operation to latch the data value of the bit signal (Bj) as the output signal (Sj) on the next clock (CLK) transition.

Thus, with the implementation of FIG. 5 the logic state of the output signal (Sj) follows the logic state of the bit signal (Bj) output from the memory 218 as shown in FIG. 4.

Reference is now made to FIG. 6 which illustrates a block diagram for an alternative embodiment of the output register circuit 216 within FIG. 3. The output register circuit is formed by j register latch circuits 310. Each circuit 310 comprises a flip-flop circuit 312 (for example, of the D-type) and a logic circuit 314. The data (D) input of the flip-flop circuit 312 is coupled to the output of the logic circuit 314. The output (Q) of the flip-flop circuit 312 is coupled to a first input of the logic circuit 314. The output (Q) of the flip-flop circuit 312 further provides the output signal (Sj). The second input of the logic circuit 314 is coupled to receive the bit signal (Bj). The third input of the logic circuit 314 is coupled to receive the increment signal (Inc) 230. The logic circuit 314 comprises an exclusive-OR (XOR) logic gate 316 having an output coupled to the data (D) input of the flip-flop circuit 312. One input of the logic gate 316 forms the first input of the logic circuit 314 and is coupled to the output (Q) of the flip-flop circuit 312. The logic circuit 314 further comprises an AND logic gate 318 having an output coupled to the other input of the logic gate 316. One input of the logic gate 318 forms the second input of the logic circuit 314 and is coupled to receive the bit signal (Bj), while the other input of the logic gate 318 forms the third input of the logic circuit 314 and is coupled to receive the increment signal (Inc) 230.

The AND logic gate 318 functions as a pass gate enabled by a logic high state of the increment signal (Inc) 230 to pass the logic value of the bit signal (Bj) to the other input of the exclusive-OR (XOR) logic gate 316. The logic value output from the memory 218 in this embodiment is a data transition indicator. In this regard, if the logic value of the bit signal (Bj) is logic low, this indicates that there should be no transition of logic state for the output signal (Sj). Conversely, if the logic value of the bit signal (Bj) is logic high, this indicates that the logic state for the output signal (Sj) should transition (i.e., switch or toggle from logic high to low or from logic low to high). This transition control is effectuated through the logical operation performed by the exclusive-OR (XOR) logic gate 316. For example, if the logic gate 318 outputs a logic low signal (indicating no transition), and if the current value of the output signal (Sj) is also logic low, the XOR logic gate 318 functions to apply a logic low value to the data (D) input of the flip-flop circuit 312 and the output signal (Sj) remains at logic low. Conversely, if the logic gate 318 outputs a logic high signal (indicating a transition), and if the current value of the output signal (Sj) is logic low, the XOR logic gate 318 functions to apply a logic high value to the data (D) input of the flip-flop circuit 312 and the output signal (Sj) toggles to logic high at the next clock (CLK) transition.

Reference is once again made to the table (see above) for a description of operation of the circuit 216 of FIG. 6 when used within the circuit of FIG. 3. The counter circuit 220 is reset and outputs a data value of "0" as the count signal 222. The memory 218 outputs the stored bit data <1 . . . 10> (in this embodiment as transition bits) at the address "a" as the bit signals (B1-Bj) 224. The transition point data value at address "a" is "0", and thus a data value of "0" for the count signal 222 is output to the comparator circuit 234. The comparator circuit 234 compares the count signal 222 (data value "0") to the data signal 236 (data value "0") and finds a match. In response thereto, the increment signal 230 pulses active. The AND logic gates 318 pass the output bit signals (B1-Bj) to the XOR logic gate 318. For each output bit signal (B1-Bj) that is logic low, the XOR logic gate 318 will apply the logic state of the current output signal (Sj) to the input of the flip-flop circuit 312 and the output signal (Sj) at the output of the flip-flop circuit will not change state. In response to an output bit signal (B1-Bj) that is logic high, however, the XOR logic gate 318 toggle the logic state of the current output signal (Sj) for application to the input of the flip-flop resulting in a transition in output logic state at the next clock signal transition. Thus, for signal bit data <1 . . . 10> at the address "a", the first bit signal (B1) at logic "0" indicates that no transition of the output bit signal (B1) is to be made, but the second bit signal (B2) and j-th bit signal (Bj) at logic "1" indicate that the output bit signals (B1 and Bj) are to change state.

The process repeats in accordance with the foregoing examples with incrementing of the address and the counting of the counter.

Figure 7:
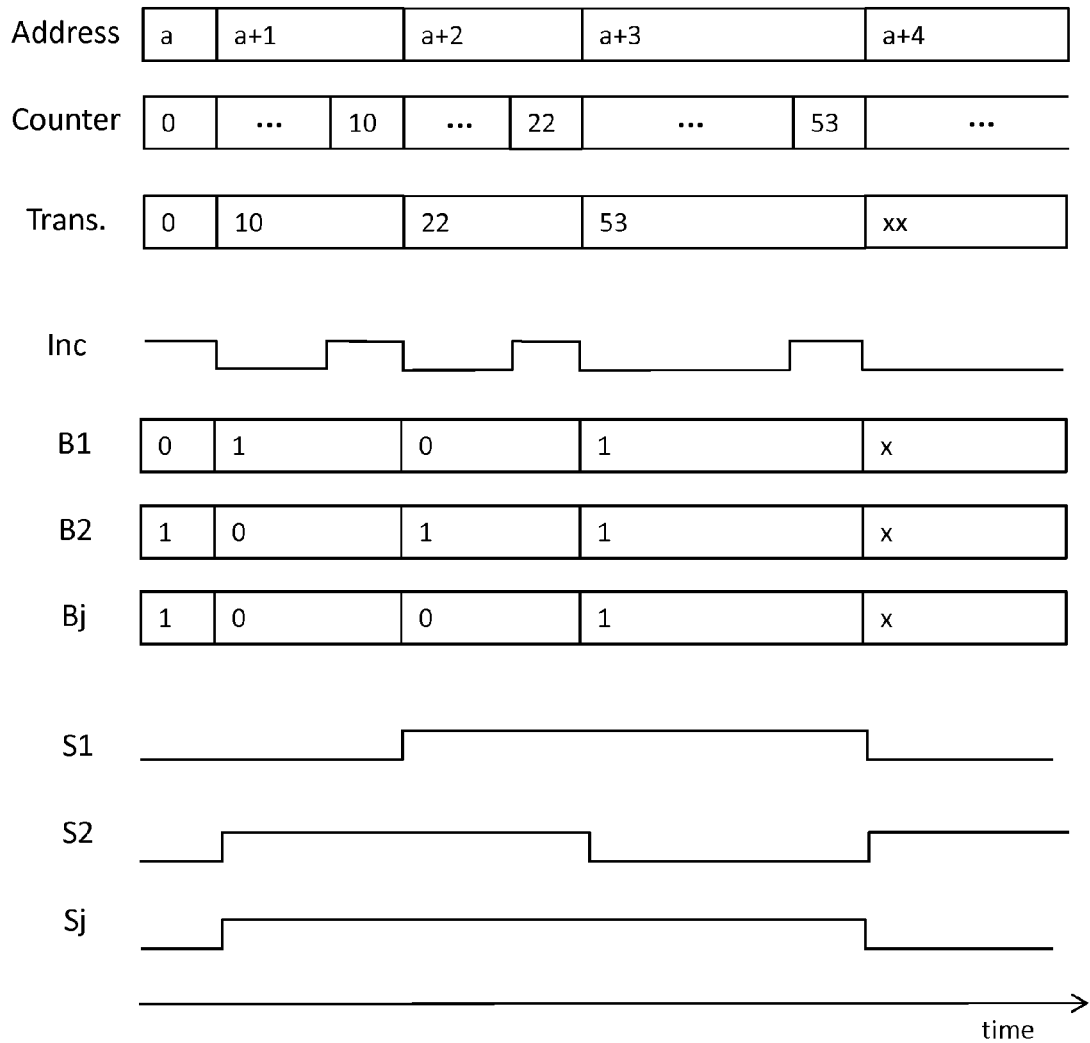
FIG. 7 illustrates the operational waveforms for the circuit of FIG. 6.

Reference is now made to FIG. 7 which illustrates the operational waveforms for the circuit of FIG. 6 using the data of the previous table. Here, the logic state of the output signals 214 toggles at the clock transition following assertion of the increment (Inc) signal when the logic state of the corresponding bit signal 224 is logic high.

The previously described embodiments primarily concern the generation of a one waveform for each output signal (S1-Sj). Instances may arise where different waveforms may need to be generated at a single one of the output signals (S1-Sj).

Figure 8:
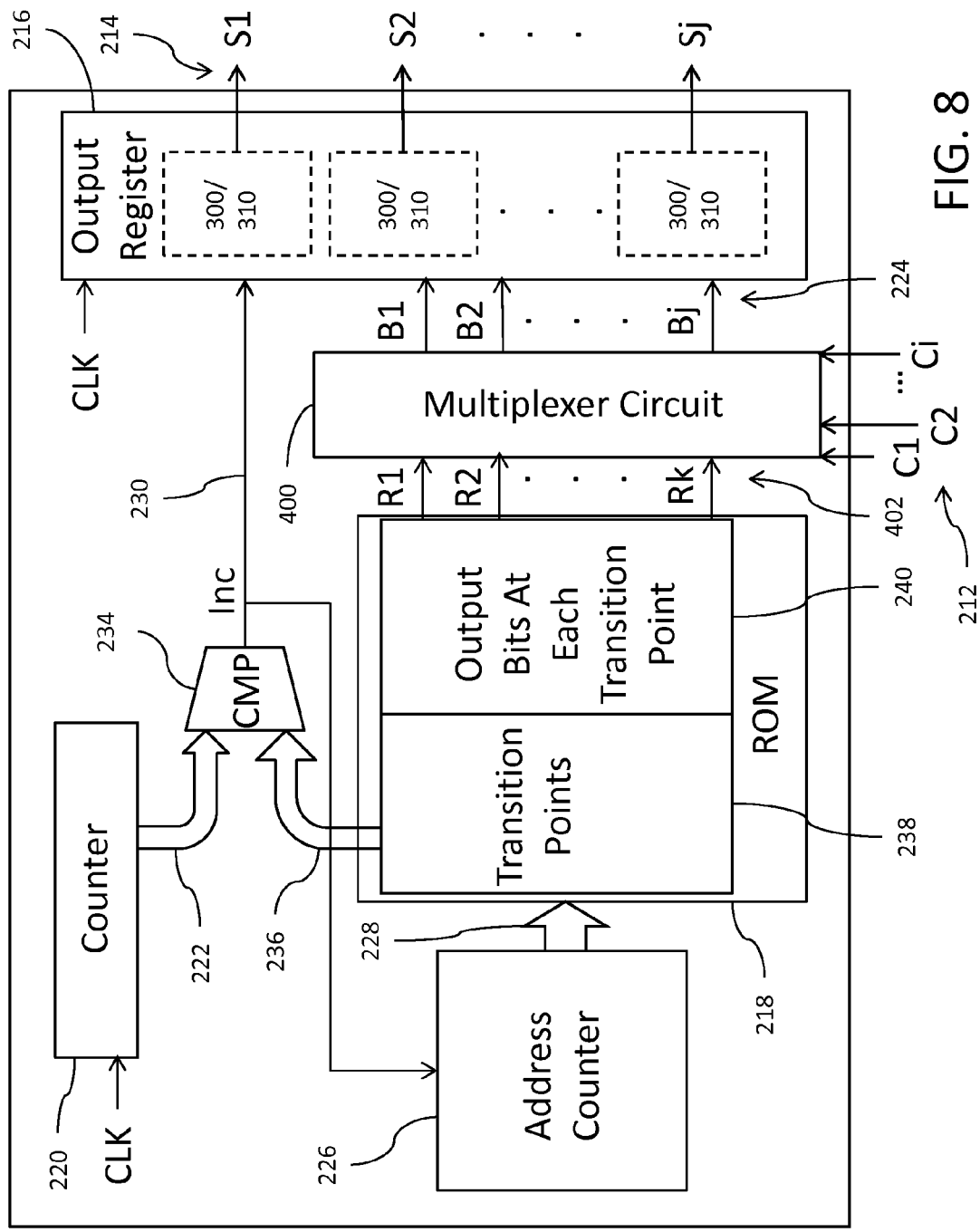
FIG. 8 is a block diagram of an embodiment for an event controlled decoding circuit.

Reference is now made to FIG. 8 where like reference numbers refer to like or similar parts. The circuit of FIG. 8 differs from the circuit of FIG. 3 in the insertion of a multiplexing circuit 400 between the memory 218 and the output register circuit 216. The multiplexing circuit 400 provides a means for selecting which data bits from the memory are to be applied as the output bit signals (B1-Bj) in response to control inputs (C1-Ci) 212. In this implementation, the output register circuit 216 includes register latch circuits 300 or 310' as shown in FIGS. 5 and 6. So, two stages of decoding are performed. There is a first stage of decoding to address the memory in response to the address counter to generate output bits (R1-Rk), and a second stage of decoding through the multiplexer circuit 400 to select certain ones of the bits (R1-Rk) as the output bit signals (B1-Bj).

The multiplexing circuit 400 receives data bits 402 (R1-Rk) from the memory 218 and control inputs (C1-Ci) 212. The data of the control inputs (C1-Ci) 212 function as selection signals for controlling the multiplexing operation in selecting certain ones of the data bits 402 (R1-Rk) for application to the output register circuit 216 as the output bit signals (B1-Bj).

Thus, with the multiplexer circuit 400 in FIG. 8, the appropriate waveforms for each output signal are already selectable. The bits for signal S1, for example, are stored separately in the memory. For example, the bits may be stored in two separate 1-bit wide columns of the memory space for producing two different waveforms for each output signal.

Figure 9:
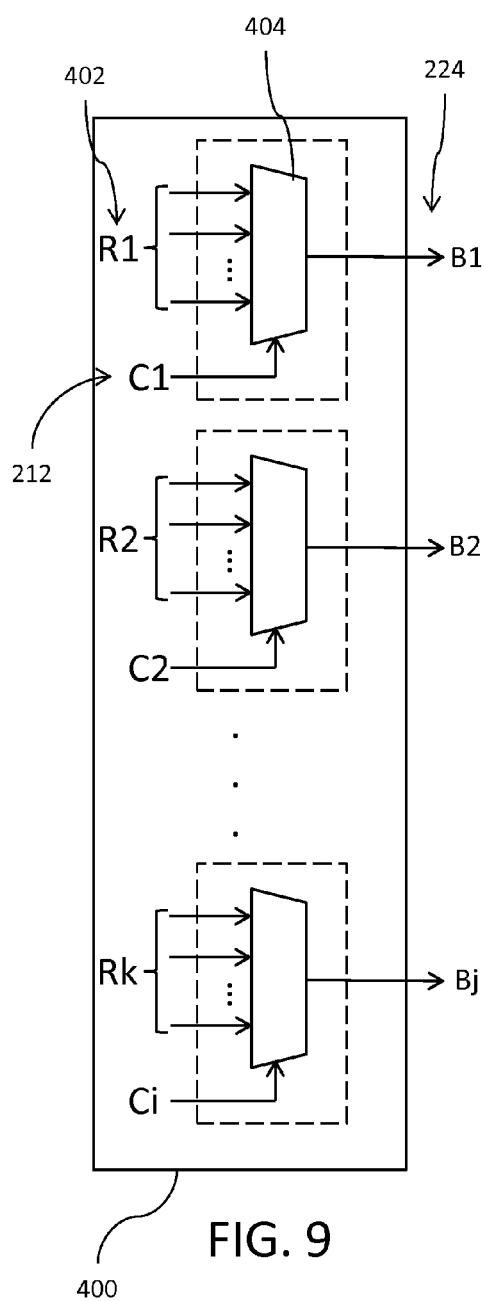
FIG. 9 is a block diagram for an embodiment of a multiplexing circuit.

FIG. 9 illustrates a block diagram for a simplified embodiment of the multiplexing circuit 400. The multiplexing circuit 400 includes j multiplexers 404. Each multiplexer 404 includes a plurality of data inputs and a data output. Each multiplexer further includes a control input. In an embodiment, the each multiplexer is a 4×1 multiplexer having four inputs, one output and a two bit control input. This implementation enables the selection from one of four data bits (Rk) 402 to generate the output bit signal (Bj) using two bits of the control inputs (Ci) 212.

The following table illustrates an exemplary implementation for the organization of the read only memory 218 along with sample stored bit data:

| Address | Transition Point | Rk | ... | R2 | R1 |
|---|---|---|---|---|---|
| a | 0 | 1101 | | 0101 | 0010 |
| a + 1 | 10 | 0111 | | 1100 | 1101 |
| a + 2 | 22 | 1110 | | 0011 | 0110 |
| a + 3 | 53 | 0001 | | 1111 | 1011 |

In the table, the reference "a" represents an address in the read only memory 218 which is the starting address. The counter circuit 220 is reset and outputs a data value of "0" as the count signal 222. The memory 218 outputs the stored bit data <1101 . . . 0000> at the address "a" as the data bits 402 (R1-Rk). The R1 bits <0010> are applied to the multiplexer inputs of the first multiplexer 404, the R2 bits <0101> are applied to the multiplexer inputs of the second multiplexer 404 . . . and the Rk bits <1101> are applied to the multiplexer inputs of the j-th multiplexer 404. The data of the control inputs (C1-Ci) 212 controls operation of the multiplexers 404 to select between the input data. For example, bits C1 and C2 of the control inputs 212 are applied to the control input of the first multiplexer to select which one of the R1 bits <0010> is to be output as the bit signal (B1). So, if C1=0 and C2=0, then the first bit "0" is output. Conversely, if C1=1 and C2=0, the second bit "1" is output. A similar operation is performed with respect to each of the multiplexers 404 in response to the control inputs 212 to make bit selections and generate the bit signals (B1-Bj).

It is important to note that the R1-Rk bits which are selected for the bit signals (B1-Bj) may, in accordance with the embodiment of FIG. 5, comprise signal bits or may, in accordance with the embodiment, of FIG. 6, comprise transition bits. In other words, the multiplexer circuit 400 is operational with the output register using either the circuit 300 (FIG. 5) or the circuit 310 (FIG. 6).

Figure 10:
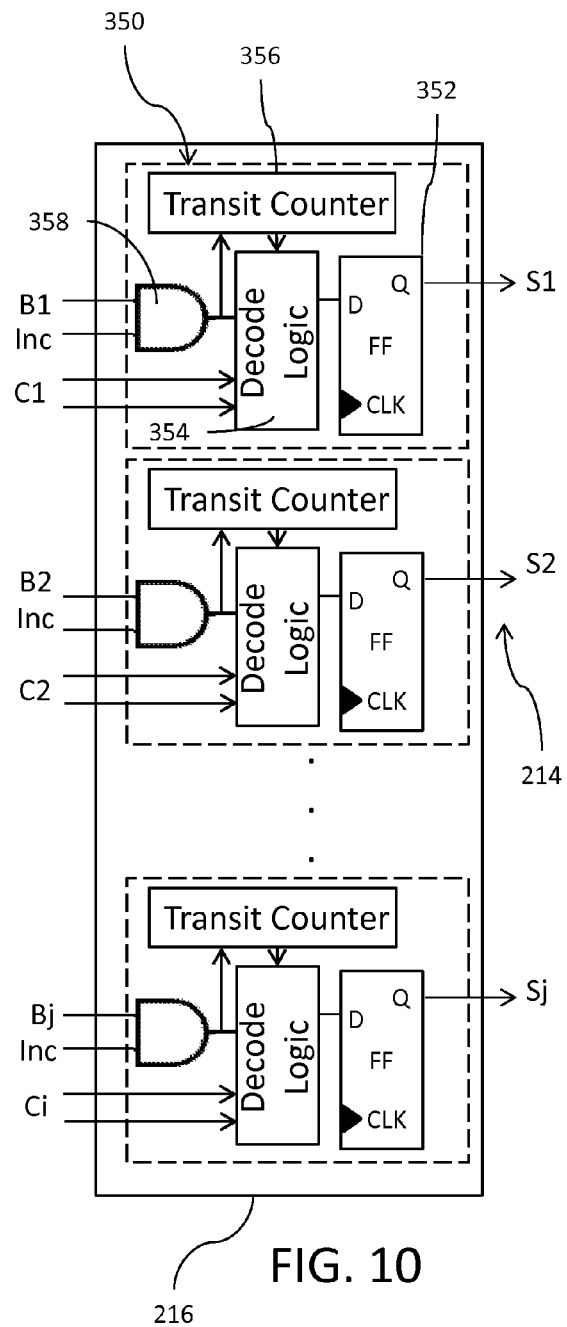
FIG. 10 is a block diagram for an embodiment of the output register circuit within FIG. 8.

Reference is now made to FIG. 10 which illustrates a block diagram for an alternative embodiment of the output register circuit 216. This register circuit 216 configuration may be used in connection with the embodiment of FIG. 3, for example (i.e., it does not require the presence of multiplexer circuit 400 as shown in FIG. 8). The output register circuit is formed by j register latch circuits 350. Each circuit 350 comprises a flip-flop circuit 352 (for example, of the D-type), a decode logic circuit 354, a counter 356 and a logic circuit 358. The data (D) input of the flip-flop circuit 352 is coupled to the output of the decode logic circuit 354. The output (Q) of the flip-flop circuit 312 provides the output signal (Sj). A first input of logic circuit 358 (in an exemplary implementation, an AND logic gate) is coupled to receive the bit signal (Bj). A second input of the logic circuit 358 is coupled to receive the increment signal (Inc) 230. The output of the logic circuit 358 provides a signal DECj which is provided as an input to both the decode logic circuit 354 and the counter 356. The output value of the counter 356 is provided as another input to the decode logic circuit 354. The decode logic circuit 354 is further coupled to receive input comprising certain bits of the control input (Ci) 212.

The logic circuit 358 pulses the signal DECj each time the bit signal (Bj) and the increment signal (Inc) 230 are both logic high. Thus, when the increment signal is high and the signal/transition data output from the memory as currently addressed are both logic high, the signal DECj is pulsed. This enables the operation of the decode logic circuit 354 and further causes the counter 356 to increment. In this regard, the counter value of the counter 356 is indicative of a count of waveform transitions (which correspond to points, as discussed above, where the data bit output from the memory is logic high). The certain bits of the control input (C1-Ci) 212 applied to the decode logic circuit 354 are decoded to identify a particular one of a plurality of waveforms for selection and through the decoding specifically identify the counter values where the output signal (Sj) is to change state (i.e., toggle). So, if the certain bits of the control input (C1-Ci) 212 are decoded to instruct toggling of the output signal (Sj) logic state at first, third and seventh counter values of the waveform transition count, then the decode logic circuit 354, when enabled by the signal DECj, will receive the current counter value from the counter 356, compare the received to the decoder identified values (first, third and seventh, in this example), and toggle the output signal (Sj) logic state when there is a counter value match.

Thus, the memory may store a single 1-bit wide column for the S1 bits. If S1=0, this indicates no transition, and conversely if S1=1, this indicates a transition. So, each bit in the column can indicate whether there is a transition in either of two distinct, for example, waveforms. In comparison then to the FIG. 8 implementation which used two separate 1-bit wide columns on the memory space, the FIG. 10 implementation merges the waveform generation data into a single column of information. When the stored bit is logic "1", the circuit of FIG. 10 determines whether that "1" is associated with a transition on one waveform or a transition on another waveform. This operation is in effect hardcoded in the logic of the FIG. 10 circuitry. So, with the FIG. 10 implementation, the amount of memory space required to store the waveform data is reduced in comparison to the FIG. 8 implementation. The transition points defined in the memory can be modified to change where transitions in the waveforms occur. However, this implementation is less flexible than the FIG. 8 implementation because the hardcoding restricts somewhat the ability to modify waveform transition points.

Figure 11:
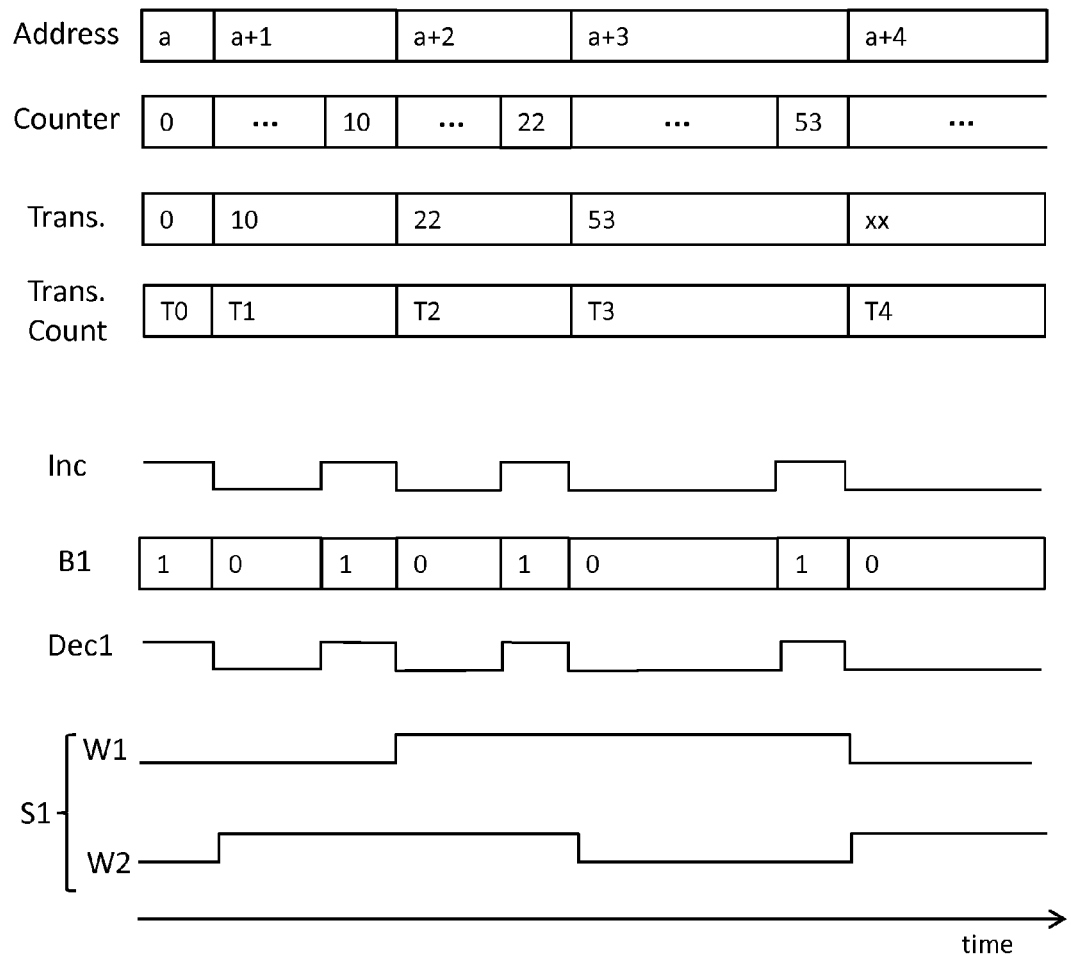
FIG. 11 illustrates the operational waveforms for the circuit of FIGS. 8 and 10.

Reference is now made to FIG. 11 which illustrates waveforms for an exemplary operation of the FIG. 10. This example concerns only the output signal (S1) and the selection between two different waveforms W1 and W2 for output. Counter values 0, 10, 22 and 53 are indicated as transition locations and marked appropriately with logic 1 values for B1. Thus, the Dec1 signal will pulse each time the increment signal (Inc) and the B1 data value are both logic 1. This causes the counter 356 to increment by one with each pulse of the Dec1 signal. The control input (Ci) 212 in this example comprises a single bit to select between the W1 and W2 signal (i.e., C1 is logic "0" for selecting the W1 signal and logic "1" for selecting the W2 signal). If the control input (C1) 212 is logic "0", the decode logic circuit 354 decodes this to identify transition points T1 and T3 as locations where the output signal (S1) changes state (toggles) to implement the W1 signal. If, on the other hand, the control input (C1) 212 is logic "1", the decode logic circuit 354 decodes this to identify transition points T0, T2 and T3 as locations where the output signal (S1) changes state (toggles) to implement the W2 signal. The advantage of this implementation is that the same bit pattern in memory can be uses to specify a plurality of waveforms, with selection between the waveforms being controlled by the control input (Ci) 212.

The design and implementation of the circuitry within the decode logic circuit 354 so as to enable output signal toggle at certain transition points is well within the capabilities of one skilled in the digital signal processing art.

It will be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
   an output circuit configured to receive data bits and generate an output signal waveform having logic state values dependent on the received data bits;
   a time counter configured to increment in response to a clock signal;
   a memory having a plurality of address locations, each address location storing a signal transition time linked to said data bits for that signal transition time, said memory outputting the data bits when the address location is addressed;
   a comparator configured to compare a counter value output from the time counter to the signal transition times stored in said memory and generate an increment signal in response to each comparison match; and
   an address counter configured to generate an address for addressing said address locations in the memory, said address counter incrementing the address in response to the increment signal at each instance of a comparison match.

2. The circuit of claim 1, wherein each data bit specifies the logic state of the output signal waveform starting at the linked signal transition time.

3. The circuit of claim 1, wherein the each data bit specifies that the logic state of the output signal waveform is to toggle at the linked signal transition time.

4. The circuit of claim 1, wherein the output circuit comprises:
   a flip-flop circuit having an input and having an output generating the output signal waveform; and
   a multiplexer circuit having an output coupled to the input of the flip-flop circuit, a first input coupled to the output of the flip-flop circuit and a second input coupled to receive said data bits from the memory;
   wherein said multiplexer circuit is configured to select between the first and second inputs in response to the logic state of the increment signal.

5. The circuit of claim 1, wherein the output circuit comprises:
   a flip-flop circuit having an input and having an output generating the output signal waveform; and
   a logic circuit having a first input coupled to the output of the flip-flop circuit, a second input coupled to receive said data bits from the memory and a third input coupled to receive the increment signal.

6. The circuit of claim 5, wherein the logic circuit comprises a first logic gate configured to receive the second and third inputs and a second logic gate configured to receive the first input and an output of the first logic gate.

7. The circuit of claim 6, wherein the first logic gate is an AND gate and the second logic gate is an XOR gate.

8. The circuit of claim 1, wherein the output circuit comprises:
   a flip-flop circuit having an input and having an output generating the output signal waveform; and
   a first multiplexer circuit having an input configured to receive multiple data bits from the memory, the multiple data bits associated with different corresponding waveforms;
   wherein said first multiplexer is configured to select from the received data bits to output a selected data bit for a selected one of the different waveforms;
   a second multiplexer having an output coupled to the input of the flip-flop circuit, a first input coupled to the output of the flip-flop circuit and a second input coupled to an output of the first multiplexer to receive the selected data bit;
   wherein said second multiplexer circuit is configured to select between the first and second inputs in response to the logic state of the increment signal.

9. The circuit of claim 1, wherein the output circuit comprises:
   a multiplexer circuit having an input configured to receive multiple data bits from the memory, the multiple data bits associated with different corresponding waveforms;
   wherein said multiplexer is configured to select from the received data bits to output a selected data bit for a selected one of the different waveforms;
   a flip-flop circuit having an input and having an output generating the output signal waveform; and
   a logic circuit having a first input coupled to the output of the flip-flop circuit, a second input coupled to receive said selected data bit and a third input coupled to receive the increment signal.

10. The circuit of claim 9, wherein the logic circuit comprises a first logic gate configured to receive the second and third inputs and a second logic gate configured to receive the first input and an output of the first logic gate.

11. The circuit of claim 10, wherein the first logic gate is an AND gate and the second logic gate is an XOR gate.

12. The circuit of claim 1, wherein the output circuit comprises:
   a flip-flop circuit having an input and having an output generating the output signal waveform;
   a logic circuit configured to detect when the output data bits and the increment signal are simultaneously asserted and in response thereto generate a decode control signal;
   a transition counter incremented in response to said decode control signal and configured to output a transition count;
   a decode logic circuit enabled by said decode control signal and configured to decode a received control signal to identify transition count values where the output signal changes state and control operation of the flip-flop circuit to change state of the output signal waveform in response to the transition count output from the transition counter matching the identified transition count values.

13. A circuit, comprising:
   a time counter configured to count a current time value;
   a memory having a plurality of address locations, each address location storing a signal transition time value, wherein each transition time value is linked to data bits which define logic state values of an output signal waveform;
   a comparator configured to compare current time value to the signal transition time values stored in said memory and generate an increment signal in response to each comparison match;
   an address counter configured to generate an address for addressing said address locations in the memory, said address counter incrementing the address in response to the increment signal, wherein said memory outputs the data bits at the addressed location in the memory; and an output circuit configured to receive the output data bits and generate the output signal waveform having logic state values dependent on said output data bits.

14. The circuit of claim 13, wherein the memory is one of a read only memory or random access memory.

15. The circuit of claim 13, wherein the output circuit is configured set the logic state of the output signal waveform to match the logic state of the output data bits.

16. The circuit of claim 13, wherein the output circuit is configured cause the logic state of the output signal waveform to toggle in response to the logic state of the output data bits.

17. The circuit of claim 13, wherein the output circuit comprises a multiplexer circuit having a plurality of inputs configured to receive the output data bits, said multiplexer circuit operable to select from the received output data bits certain ones of the output data bits to generate the output signal waveform.

18. A circuit, comprising:
 a memory having a plurality of address locations, each address location storing output data bits which define logic state values of an output signal waveform and a signal transition time value specifying a time for sequential output;
 a comparator configured to compare a current time value to the signal transition time values stored in said memory and generate an increment signal in response to each comparison match;
 an address counter configured to generate an address for sequentially addressing said address locations in the memory and increment the address in response to the increment signal, wherein said memory sequentially outputs the data bits at the addressed locations in the memory; and
 an output circuit configured to receive the sequentially output data bits from the memory and generate the output signal waveform having logic state values dependent on said sequentially output data bits.

19. The circuit of claim 18, wherein the output circuit comprises:
 a flip-flop circuit having an input and having an output generating the output signal waveform; and
 a multiplexer circuit having an output coupled to the input of the flip-flop circuit, a first input coupled to the output of the flip-flop circuit and a second input coupled to receive said sequentially output data bits from the memory;
 wherein said multiplexer circuit is configured to select between the first and second inputs in response to the logic state of the increment signal.

20. The circuit of claim 18, wherein the output circuit comprises:
 a flip-flop circuit having an input and having an output generating the output signal waveform; and
 a logic circuit having a first input coupled to the output of the flip-flop circuit, a second input coupled to receive said sequentially output data bits from the memory and a third input coupled to receive the increment signal.

21. The circuit of claim 18, wherein the output circuit comprises:
 a flip-flop circuit having an input and having an output generating the output signal waveform;
 a logic circuit configured to detect when the sequentially output data bits and the increment signal are simultaneously asserted and in response thereto generate a decode control signal;
 a transition counter incremented in response to said decode control signal and configured to output a transition count;
 a decode logic circuit enabled by said decode control signal and configured to decode a received control signal to identify transition count values where the output signal changes state and control operation of the flip-flop circuit to change state of the output signal waveform in response to the transition count output from the transition counter matching the identified transition count values.

22. The circuit of claim 18, wherein the output circuit is configured set the logic state of the output signal waveform to match the logic state of the sequentially output data bits.

23. The circuit of claim 18, wherein the output circuit is configured cause the logic state of the output signal waveform to toggle in response to the logic state of the sequentially output data bits.

* * * * *